US012739973B2

(12) United States Patent
Surbon

(10) Patent No.: US 12,739,973 B2
(45) Date of Patent: Sep. 15, 2026

(54) MEMBER FOR INTERCONNECTING ELECTRICALLY A PRINTED CIRCUIT BOARD AND AT LEAST ONE PIECE OF ELECTRICAL EQUIPMENT, AND CONNECTING METHOD

(71) Applicant: SAFRAN, Paris (FR)

(72) Inventor: Jean-Claude Surbon, Moissy-Cramayel (FR)

(73) Assignee: SAFRAN, Paris (FR)

( * ) Notice: Subject to any disclaimer, the term of this patent is extended or adjusted under 35 U.S.C. 154(b) by 194 days.

(21) Appl. No.: 18/835,124

(22) PCT Filed: Feb. 7, 2023

(86) PCT No.: PCT/EP2023/052915
§ 371 (c)(1),
(2) Date: Aug. 1, 2024

(87) PCT Pub. No.: WO2023/156249
PCT Pub. Date: Aug. 24, 2023

(65) Prior Publication Data
US 2025/0185164 A1 Jun. 5, 2025

(30) Foreign Application Priority Data
Feb. 15, 2022 (FR) ....................................... 2201302

(51) Int. Cl.
*H05K 1/11* (2006.01)
*B64D 47/00* (2006.01)
(Continued)

(52) U.S. Cl.
CPC ............... *H05K 1/11* (2013.01); *B64D 47/00* (2013.01)

(58) Field of Classification Search
CPC .......... H05K 1/11; H05K 1/144; H05K 3/107; H05K 3/361; H05K 3/368;
(Continued)

(56) References Cited

U.S. PATENT DOCUMENTS 7,233,160 B2 * 6/2007 Hayden .............. G01R 1/06772 324/755.07
7,764,072 B2 * 7/2010 Strid .................. G01R 1/06772 324/149

(Continued)

FOREIGN PATENT DOCUMENTS

WO 2020141445 A1 7/2020
WO 2021073828 A1 4/2021

OTHER PUBLICATIONS

International Search Report for PCT/EP2023/052915, filed Apr. 24, 2023, 2 pages.
French Search Report for FR2201302, filed Nov. 3, 2022, 2 pages.

*Primary Examiner* — Timothy J Thompson
*Assistant Examiner* — Amol H Patel
(74) *Attorney, Agent, or Firm* — RANKIN, HILL & CLARK LLP

(57) ABSTRACT

An electrically interconnecting member configured to electrically join a printed circuit board belonging to a mechanical part to a piece of electrical equipment. The printed circuit board comprising output tracks. The electrically interconnecting member comprising: a contact surface configured to be fastened to the mechanical part, a free surface opposite the contact surface, input terminals placed on the contact surface and configured to be superposed on the output tracks of the printed circuit board, and output interfaces placed on the free surface at distance from the input terminals and configured to be connected to the piece of electrical equipment, at least one input terminal comprising a cavity con- (Continued)

figured to receive a conductive adhesive so as to connect together the input terminal and the output terminal when they are superposed.

17 Claims, 5 Drawing Sheets

(51) Int. Cl.
*H05K 1/09* (2006.01)
*H05K 1/14* (2006.01)
*H05K 3/10* (2006.01)
*H05K 3/36* (2006.01)

(58) Field of Classification Search
CPC .......... H05K 2201/09181; H05K 2201/09745; H05K 2201/09036
See application file for complete search history.

(56) References Cited

U.S. PATENT DOCUMENTS

| | | | | |
|---|---|---|---|---|
| 2005/0275090 | A1 | 12/2005 | Nakazawa | |
| 2012/0026700 | A1* | 2/2012 | Furuta | H05K 3/361 361/750 |
| 2016/0234937 | A1* | 8/2016 | Su | H05K 1/111 |
| 2017/0156213 | A1 | 6/2017 | Ishikawa | |
| 2024/0091528 | A1* | 3/2024 | Fallegger | A61N 1/05 |

* cited by examiner

MEMBER FOR INTERCONNECTING ELECTRICALLY A PRINTED CIRCUIT BOARD AND AT LEAST ONE PIECE OF ELECTRICAL EQUIPMENT, AND CONNECTING METHOD

BACKGROUND

The present invention relates to the field of electrical connection between a printed circuit board and a piece of electrical equipment, in particular, between a printed circuit board of an electronic sensor mounted on a mechanical part of an aircraft turbomachine and a computing member of said aircraft turbomachine.

In the aerospace industry, one or more sensors are installed on mechanical parts of a turbomachine to measure temperature, pressure or other physical parameters during operation of the turbomachine.

In particular, stationary vanes such as the compressor stator vanes or the turbine stator vanes may be equipped with one or more sensors. Such sensors are connected to a computing member, such as an electronic board, in order to process the signals received.

In a known way, such a sensor comprises a printed circuit board and output tracks configured to be connected to the flexible connectors of the computing member, usually in the form of enameled single-strand copper wires with a small cross-section. To reduce the mass, avoid inducing unbalance and minimize the friction induced by the presence of the sensors, the circuit is printed on the external surface of the stationary vane. Such a printed circuit board is fragile.

In practice, connecting the connectors of the computing member to the output tracks of the printed circuit board is a tedious operation that may only be carried out manually, requiring a conductive adhesive, such as silver paste, to be applied to the output tracks using a brush or a syringe. Each connector is then pressed one after the other onto the output tracks until the conductive adhesive has completely dried to establish the electrical connection. In addition to being time-consuming and non-manufacturable, such an operation has the disadvantage of being liable to damage the printed circuit board by scratching and/or generating a short-circuit if the adhesive spills onto a neighboring output track, particularly if the output tracks are very close together. Furthermore, such a connection is fragile and liable to be torn off during handling or operation due to aerodynamic stresses (temperature, pressure, etc.).

Alternatively, the electrical connection may be made by tin soldering or wire bonding, which has the same disadvantages. It is also known to use relay lugs to connect the piece of electrical equipment to the printed circuit board, but this undesirably disturbs the air flow and reduces the aerodynamics in the aircraft turbomachine.

The invention aims to eliminate at least some of these disadvantages.

Although the invention was originally designed to connect a sensor printed on a stationary vane to a computing member in an aircraft turbomachine, the invention may be applied to any mechanical part comprising a printed circuit board.

SUMMARY

The invention relates to an electrically interconnecting member configured to electrically connect a printed circuit board belonging to a mechanical part to at least one piece of electrical equipment, the printed circuit board comprising a plurality of output tracks, said electrically interconnecting member comprising;

- a contact surface configured to be fastened to the mechanical part,
- a free surface opposite the contact surface,
- a plurality of input terminals placed on the contact surface, each input terminal being configured to be superimposed on an output track of the printed circuit board,
- a plurality of output interfaces placed on the free surface at distance from the input terminals and configured to be connected to the piece of electrical equipment,
- each input terminal being connected to an output interface by an electrical track,
- at least one input terminal of said plurality of input terminals comprising a cavity configured to receive a conductive adhesive so as to connect together the input terminal and the output track when they are superimposed.

The electrically interconnecting member according to the invention is an intermediary between the printed circuit board and the piece of electrical equipment, making their electrical connection easier and more durable. The input terminals of the electrically interconnecting member and the output tracks of the printed sensor may be connected simply and conveniently by superimposing and distributing electrically conductive adhesive in the cavity provided. The cavity allows to facilitate the application and the distribution of the conductive adhesive. This allows to ensure a reliable mechanical and electrical connection, with no risk of the conductive adhesive spilling onto the printed circuit board and generating a short-circuit. In addition, the right amount of conductive adhesive is used. Finally, the cavity allows to hold the conductive adhesive and makes it easier to apply.

In addition, the contact surface of the electrically interconnecting member makes it easier to superimpose the input terminals on the output tracks, by fastening them directly to the mechanical part. The output interfaces formed on the free surface remain accessible after fastening to the part and are formed remotely for easy connection of the piece of electrical equipment. It results in a durable electrical connection that preserves the aerodynamics of a mechanical engine part, in particular an aircraft turbomachine part, such as an aircraft vane.

Preferably, each input terminal comprises a cavity configured to receive a conductive adhesive so as to connect the input terminal and the output track together when they are superimposed.

According to one aspect of the invention, each input terminal extends longitudinally, and preferably the cavity extends over at least a longitudinal portion of the input terminal.

This makes superimposing easy, and the connection between the input terminal and the output track is reliable and durable.

According to one aspect of the invention, the spacing between two adjacent output interfaces is greater than the spacing between two adjacent input terminals. The piece of electrical equipment may therefore be easily connected to the output interfaces, without the risk of scratching or spilling conductive adhesive onto the printed circuit board as in the prior art.

According to one aspect of the invention, the cavity comprises a supply opening accessible from the free surface or from a peripheral edge of the interconnecting member. The supply opening facilitates the deposition of the conductive adhesive and supplies the cavity. It is not necessary to apply the adhesive directly into the cavity, which may be very small or very narrow. This reduces the risk of conductive adhesive spillage.

According to one aspect of the invention, the electrically interconnecting member comprises at the level of the peripheral edge at least one notch into which the supply opening opens. The notch forms a guide for positioning a syringe for injecting adhesive or the like. Preferably, the notch has a circular shape, in particular centered on the supply opening. Such a notch allows to facilitate the supply, particularly when the contact surface is not accessible, i.e. when the electrically interconnecting member is fastened to the part. The deposition of conductive adhesive becomes easier and may be industrialized.

Preferably, each input terminal is associated with a notch into which the supply opening of said input terminal opens. In other words, the cavity of each input terminal is supplied with conductive adhesive via its own notch.

According to one aspect of the invention, the cavity of at least one input terminal comprises a capillary structure so as to promote the distribution of the conductive adhesive throughout the cavity. In other words, the cavity is narrow so that the conductive adhesive, under the effect of surface tension, is distributed throughout the cavity, a phenomenon known as capillarity. Advantageously, all that is required is a rough application of the conductive adhesive, which is distributed evenly in the cavity under the effect of the capillary action. Such a capillary cavity of this kind therefore provides a sufficient and reliable connection thanks to the even distribution of the conductive adhesive. Thanks to the shape of the cavity, no manual action is required to spread the conductive adhesive.

Preferably, the cavity of each input terminal comprises a capillary structure.

Preferably, the cavity is less than 1 mm wide, preferably less than 0.6 mm and more preferably less than 0.3 mm. Such a narrow cavity has a capillary structure.

According to one aspect of the invention, at least one input terminal comprises two lateral branches delimiting the cavity, the two lateral branches preferably being conductive. The lateral branches of an input terminal allow an easy superimposition with an output track of the printed circuit board. The cavity is easily defined by the lateral branches. The conductive lateral branches, together with the conductive adhesive, allow the electrical contact to be made with the printed circuit board.

Preferably, each input terminal comprises two lateral branches delimiting the cavity.

According to a preferred aspect, the lateral branches comprise a portion where they are spaced apart to delimit the notch. The notch is thus formed in a simple way, in continuity with the cavity and the supply opening.

According to one aspect of the invention, the electrically interconnecting member comprises a plurality of through fastening openings which are distributed. The through openings allow the electrically interconnecting member to be fastened to the mechanical part by adhesive gluing. Advantageously, the adhesive may be applied once the contact surface has been positioned against the surface of the mechanical part. A second function of the through fastening openings is to provide a degree of flexibility for the electrically interconnecting member and to limit the mechanical stress at the level of the fastening.

In a preferred aspect, the electrically interconnecting member comprises a thin structure. Preferably, the electrically interconnecting member is less than 2 mm thick, preferably less than 1 mm. Advantageously, such an electrically interconnecting member comprises minimal overall dimensions and allows the aerodynamics of the mechanical part to be maintained.

In a preferred aspect, the electrically interconnecting member comprises a flexible structure. Preferably, the electrically interconnecting member comprises a polymer material. This allows the electrically interconnecting member to conform to the shape of the mechanical part for easy fastening.

The invention also relates to a method for the additive manufacture of the electrically interconnecting member as described above.

The invention also relates to the assembly of a part comprising a printed circuit board and an electrically interconnecting member such as hereinbefore described, the printed circuit board comprising a plurality of output tracks, wherein:

- the contact surface of the electrically interconnecting member is fastened to the mechanical part, and
- the input terminals of the electrically interconnecting member are superimposed on the output tracks of the printed circuit board, at least one input terminal comprising a cavity filled with conductive adhesive connecting the input terminal together with the output track on which it is superimposed.

The assembly of the part and of the electrically interconnecting member provides a reliable and durable connection between the printed circuit board and the input terminals of the electrically interconnecting member, while preserving aerodynamics.

According to one aspect of the invention, the assembly further comprises at least one piece of electrical equipment connected to the output interfaces of the electrically interconnecting member so as to be electrically connected to the printed circuit board.

According to a preferred aspect of the invention, the mechanical part is in the form of an engine part, preferably an aircraft turbomachine part. Preferably, the mechanical part is in the form of a stationary aircraft turbomachine vane, preferably a compressor stator vane or a turbine stator vane. Advantageously, the electrically interconnecting member helps to preserve the aerodynamics of such a part and prevents any unexpected tearing out of the connectors of the piece of electrical equipment.

According to a preferred aspect, the printed circuit board is an electrical sensor printed circuit board mounted on the mechanical part.

In a preferred aspect, the piece of electrical equipment is in the form of an aircraft turbomachine computer.

The invention also relates to an aircraft turbomachine comprising an assembly as described above.

The invention also relates to an aircraft comprising a turbomachine as described above.

The invention also relates to a method for electrically connecting the electrically interconnecting member as previously described to a printed circuit board belonging to a mechanical part, said method comprising steps consisting of:

- positioning the electrically interconnecting member on the mechanical part so that the input terminals of the electrically interconnecting member and the output tracks of the printed circuit board are superimposed,
- fastening the electrically interconnecting member to the mechanical part, and
- filling the cavity of at least one input terminal of the electrically interconnecting member with a conductive adhesive, so as to electrically connect the input terminal to the output track of the printed circuit board on which it is superimposed.

Such an electrical connection method is advantageously simple and quick to implement, suitable for an assembly-line manufacture and allowing a reliable and durable connection to be obtained. In particular, the cavity of each input terminal of the electrically interconnecting member allows easy application, metering and distribution of conductive adhesive, without any risk of scratching or spilling onto the printed circuit board.

Preferably, the electrical connection method further comprises a step of connecting the piece of electrical equipment to the output interfaces of the electrically interconnecting member.

The electrical connection of a piece of electrical equipment to a printed circuit board on a part is advantageously simple and quick to implement thanks to the electrically interconnecting member. Advantageously, the output interfaces are positioned at a distance from the input terminals, allowing an easy connection to the connectors of the piece of electrical equipment.

DESCRIPTION OF DRAWINGS

The invention will be better understood on reading the following description, given by way of example, with reference to the following figures, given by way of non-limiting examples, wherein identical references are given to similar objects.

It should be noted that the figures set out the invention in detail in order to implement the invention, said figures of course being able to be used to better define the invention if necessary.

DETAILED DESCRIPTION

Figure 1:
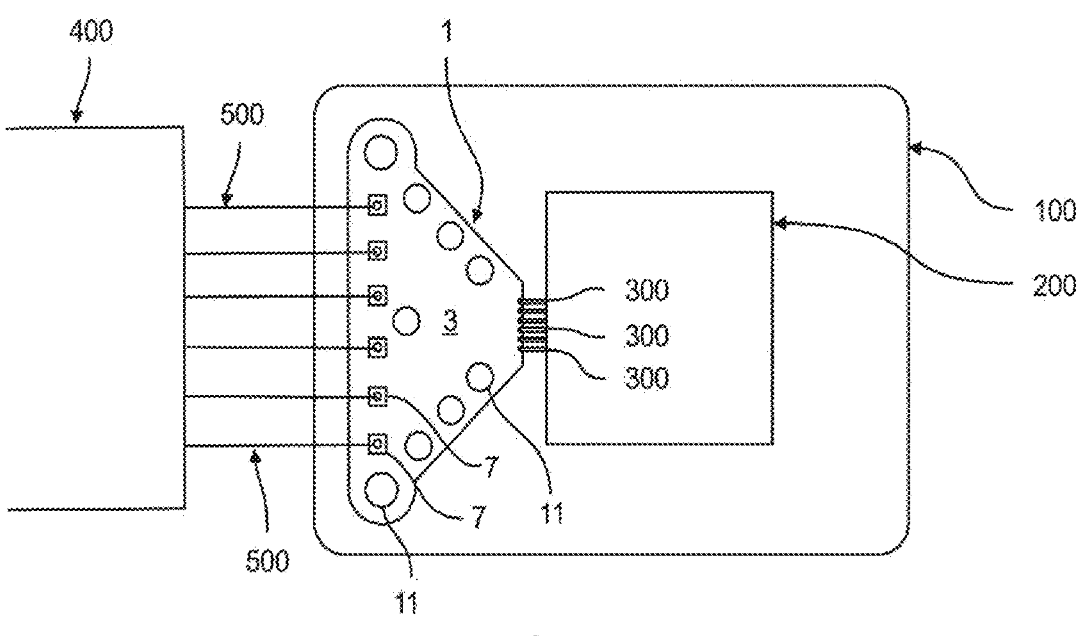
FIG. 1 is a schematic representation in plan view of an assembly of the piece of electrical equipment connected to a printed circuit board belonging to a mechanical part via an electrically interconnecting member according to the invention.

With reference to [FIG. 1], the invention relates to an electrically interconnecting member 1 for connecting a piece of electrical equipment 400 to a printed circuit board 200 belonging to a mechanical part 100.

Mechanical part 100 refers to a machine part subject to kinematics and dynamics, such as an engine part. The mechanical part 100 is preferably in the form of an aeronautical part, in particular a stationary aircraft turbomachine vane, preferably a compressor stator vane or a turbine stator vane. The invention is of particular interest for such a mechanical part 100 because the electrically interconnecting member 1 allows the aerodynamics to be preserved and ensures a permanent fastening to the surface of the mechanical part 100, which may in particular be curved.

In a known way, the printed circuit board 200 is formed on the surface of the mechanical part 100, i.e. the mechanical part 100 forms the support for the printed circuit board 200. In a known way, a printed circuit board 200 comprises an assembly of electrical calculation and/or control elements (not shown) mounted on an electrically insulating support, namely the surface of the mechanical part 100, and connected by conductive electrical tracks (not shown), usually made of copper, formed on the insulating support. The printed circuit board 200 comprises output tracks 300, illustrated in [FIG. 1]. The printed circuit board 200 is preferably produced by engraving or printing. Preferably, the output tracks 300 are very close to each other and the spacing between two adjacent output tracks 300 is less than 0.5 mm and preferably less than 0.3 mm. The output tracks 300 extend longitudinally, preferably in parallel.

No further description is given of the structure of a printed circuit board 200, which is known to the person skilled in the art.

Preferably, the printed circuit board 200 is in the form of a sensor for measuring the environment of the mechanical part 100. Preferably, the printed circuit board 200 is in the form of a temperature sensor, particularly in the case of an aeronautical part 100. It goes without saying that another physical parameter, such as pressure, could be measured.

In this example, the piece of electrical equipment 400, in particular the electronics, is in the form of an aircraft turbomachine computer comprising electrical connectors 500, preferably flexible, to be connected to the output tracks 300 of the printed circuit board 200 of the electrical sensor. The computer allows to read the measurements, such as temperature, taken by the sensor. The connectors 500 allow the printed circuit board 200, mounted on the surface of the mechanical part 100 to measure a physical parameter in the aircraft turbomachine, to be connected in a Pilar manner to the computer, which is mounted away from the aircraft turbomachine to be protected in particular from heat and vibrations. There is no further description of the computer of an aircraft turbomachine, which is known to the person skilled in the art.

Unlike the prior art, which taught a direct connection between the piece of electrical equipment and the integrated circuit, the present invention proposes the use of an electrically interconnecting member in order to facilitate the electrical connection and make the latter reproducible and industrialisable.

Figure 2:
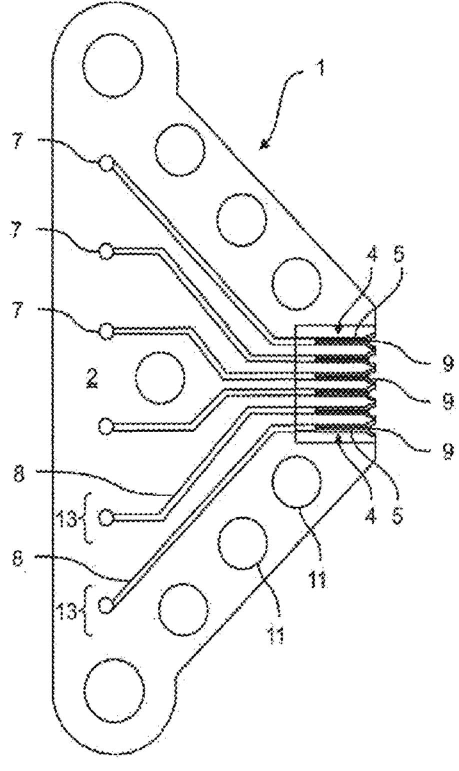
FIG. 2 is a schematic representation of the top view of the contact surface of the electrically interconnecting member of [FIG. 1].
Figure 3:
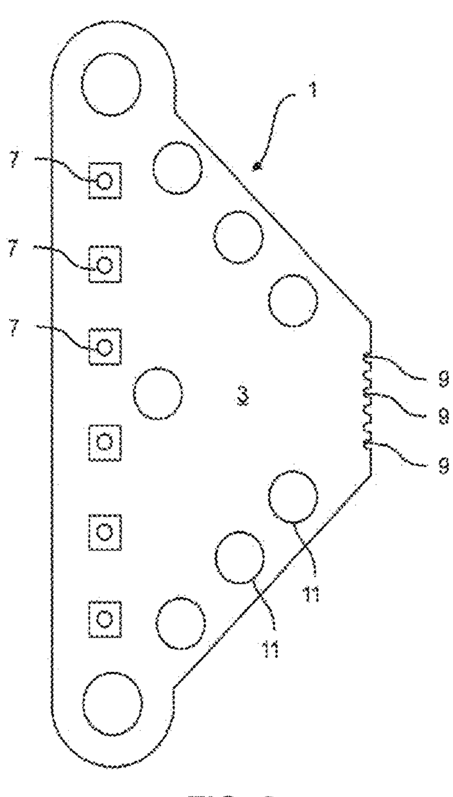
FIG. 3 is a schematic top view of the free surface of the electrically interconnecting member in [FIG. 1]

According to an embodiment illustrated in FIGS. 1 to 3, the electrically interconnecting member 1 comprises:

- a contact surface 2 (see [FIG. 2]) configured to be fastened to the mechanical part 100,
- a free surface 3 (see FIGS. 1 and 3), opposite the contact surface 2,
- input terminals 4 arranged on the contact surface 2, each input terminal 4 being configured to be superimposed on an output track 300 of the printed circuit board 200,
- output interfaces 7 arranged on the free surface 3 at a distance from the input terminals 4 and configured for connection to the piece of electrical equipment 400, and
- each input terminal 4 being connected to an output interface 7 by an electrical track 8,
- at least one input terminal 4 comprising a cavity 5 configured to receive a conductive adhesive 6 so as to connect together the input terminal 4 and the output track 300 when they are superimposed.

The electrically interconnecting member 1 thus acts as an intermediary between the piece of electrical equipment 400 and the printed circuit board 200, making it easier to connect them and improving their strength. In other words, the connectors 500 of the piece of electrical equipment 400 are connected indirectly to the output tracks 300 of the printed circuit board 200, via the electrically interconnecting member 1.

Preferably, the electrically interconnecting member 1 comprises a flexible structure to match the shape of the mechanical part 100, for example a curved part in the context of an aircraft turbomachine vane. This makes it easier to fasten to the surface of the mechanical part 100 and helps preserve the aerodynamics of the mechanical part 100. Preferably, the electrically interconnecting member 1 comprises a polymer material, such as Bakelite. According to a preferred aspect, the electrically interconnecting member 1 is obtained by additive manufacturing, Preferably also, the electrically interconnecting member 1 comprises a thin structure. The thickness of the electrically interconnecting member 1, defined between the contact surface 2 and the free surface 3, is preferably less than 2 mm, preferably less than 1 mm. This allows to reduce the overall dimensions and weight and helps to preserve the aerodynamics of the part 100.

Preferably, the electrically interconnecting member 1 has a flat structure and is in the form of a printed circuit board.

According to one aspect of the invention illustrated in FIGS. 1 to 3, the contact surface 2 of the electrically interconnecting member 1 is fastened to the mechanical part 100 by adhesive gluing. Preferably, the electrically interconnecting member 1 comprises one or more through fastening openings 11 in the electrically interconnecting member 1 to facilitate gluing to the mechanical part 100. The through openings 11 allow the adhesive to be applied once the electrically interconnecting member 1 has been placed on the part 100, by depositing the adhesive in the through openings 11 on the surface of the part 100. The through openings 11 are distributed over the surface of the electrically interconnecting member 1 and help to provide a multi-point connection, allowing to contribute to the flexibility of the electrically interconnecting member 1 to deform and conform to the shape of the mechanical part 100.

Preferably, the electrically interconnecting member 1 comprises a plurality of through openings 11, the through openings 11 being nine in number in the example of FIGS. 1 to 3. A plurality of gluing points ensures an effective fastening of the electrically interconnecting member 1 to the part 100 and prevents any undesirable detachment. In the example shown in FIGS. 1 to 3, several through openings 11 are located at the periphery of the electrically interconnecting member 1 for an optimum peripheral fastening. In addition, a through opening 11 is positioned substantially centrally to improve fastening, particularly in the case of a part 100 with a concave curved surface. In the example shown in FIGS. 1 to 3, each through opening 11 comprises a circular shape, but it goes without saying that other shapes could be suitable. Again in this example, the diameter of a through opening 11 is between 2 mm and 8 mm.

It goes without saying that the invention could be devoid of through openings 11, the adhesive or any adhesive means then being applied in advance to the contact surface 2 by way of example. The electrically interconnecting member 1 could also be fastened to the part 100 in a way other than by gluing, such as with screws or bolts, or even by welding, by way of non-limiting examples. Preferably, the electrically interconnecting member 1 is fastened at fastening points located at a distance from the input terminals 4, the electrical tracks 8 and the output interfaces 7.

Still referring to FIGS. 1 to 3 and as previously described, the electrically interconnecting member 1 comprises input terminals 4, configured to be connected to the printed circuit board 200, and output interfaces 7, configured to be connected to the piece of electrical equipment 400. In this example, each output interface 7 is associated with an input terminal 4 and is connected to it by an electrical track 8. In other words, the input terminals 4 and output interfaces 7 are connected in pairs by electrical tracks 8. The number of output interfaces 7 is therefore equal to the number of input terminals 4 and the number of electrical tracks 8. The assembly of an output interface 7, an input terminal 4 and an electrical track 8 connecting them forms an electrical line 13 (see [FIG. 2]). The electrical lines 13 are independent of each other. In other words, each electrical line 13 extends separately and distinctly from the other electrical lines 13.

In practice, the number of electrical lines 13 is determined from and equal to the number of output tracks 300 on the printed circuit board 200. In the example shown in [FIG. 1], the printed circuit board 200 comprises six output tracks 300 and the electrically interconnecting member 1 accordingly has six electrical lines 13. Preferably, the number of electrical lines 13, i.e. the number of input terminals 4, is between three and ten.

According to the invention and as illustrated in [FIG. 2], the output interfaces 7 are formed on the free surface 3 of the electrically interconnecting member 1, so as to be accessible once the electrically interconnecting member 1 has been fastened to the mechanical part 100. This allows the piece of electrical equipment 400 to be connected after the electrically interconnecting member 1 has been fastened to the mechanical part 100.

As illustrated in FIGS. 2 and 3, the spacing between two adjacent output interfaces 7 is greater than the spacing between two adjacent input terminals 4 so as to facilitate connection of the piece of electrical equipment 400. The electrically interconnecting member 1 may therefore take account of the spacing constraints of the printed circuit board 200 and offset the output interfaces. To this end, the electrically interconnecting member 1 has a flared shape from the input terminals 4 towards the output interfaces 7. Preferably, the electrically interconnecting member 1 has a parallelogram shape.

The spacing between two adjacent input terminals 4 is between 0.7 mm and 10 mm, preferably between 1.4 mm and 2 mm. The spacing between two adjacent output interfaces 7 is between 1 mm and 45 mm, preferably between 3 mm and 8 mm. The spacing depends on the number of connections to be made.

Preferably, the output interfaces 7 take the form of conventional electrical terminations, such as metallized openings, known to the person skilled in the art as "vias" and illustrated in [FIG. 2], or metallized bars, known as "pads", by way of non-limiting examples. Advantageously, because the output interfaces 7 are sufficiently far apart from each other and from the input terminals 4, various types of connection may be used simply and conveniently, without the need for precision assembly steps or the risk of short-circuiting or damage. In practice, the shape of the output interfaces 7 is determined as a function of the shape of the connectors 500 on the piece of electrical equipment 400.

With reference to FIGS. 2 and 3, the electrical tracks 8 are preferably not visible on the free surface 3 so as to be protected from the environment of the mechanical part 100 once the electrically interconnecting member 1 has been fastened. Preferably, the electrical tracks 8 are formed on the contact surface 2. Each electrical track 8 is in the form of a metallized channel formed on the contact surface 2, printed or engraved, and of small thickness, less than 0.1 mm. Preferably, the electrical tracks 8 are obtained by additive manufacturing, in a similar way to the output interfaces 7. Preferably, the electrical tracks 8 are silver-based, as are the output interfaces 7.

According to the invention and as illustrated in [FIG. 2], the input terminals 4 are formed on the contact surface 2 so as to be superimposable on the output tracks 300 of the printed circuit board 200. In practice, the position and the shape of the input terminals 4 are determined by those of the output tracks 300 on the printed circuit board 200. The output tracks 300 are preferably in the form of metallized lines, known as pads, and the spacing between two adjacent output tracks 300 is very small, i.e. less than 2 mm, preferably less than 1.6 mm. The result is an identical spacing between two adjacent input terminals 4. The input terminals 4 extend longitudinally and in parallel.

Figure 4:
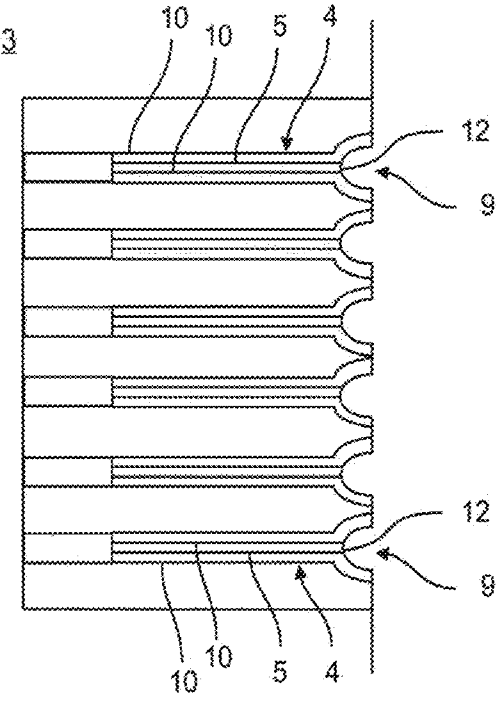
FIG. 4 is a schematic representation of the top view of the input terminals of the electrically interconnecting member of [FIG. 1]
Figure 5:
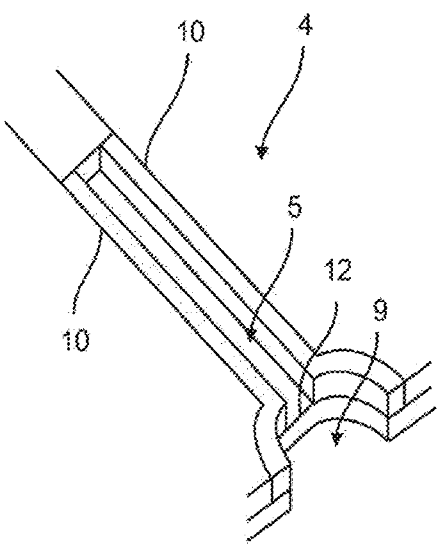
FIG. 5 is a schematic perspective representation of an input terminal of the electrically interconnecting member of [FIG. 1]

With reference to FIGS. 4 and 5, each input terminal 4 comprises a cavity 5 configured to receive a conductive adhesive, preferably silver-based, which allows an input terminal 4 to be fastened together with the superimposed output track 300 and to ensure the electrical connection. In this example, the input terminals 4 extend longitudinally and comprise a longitudinally extending cavity in a portion of the input terminal 4. Preferably, as shown in FIGS. 4 and 5, the cavity 5 is not continuous but blind. Still referring to FIGS. 4 and 5, the cavity 5 is open on the contact surface 2 to ensure the electrical connection with the superimposed output track 300. According to a preferred embodiment of the invention illustrated in FIGS. 4 and 5, the cavity 5 takes the form of a channel bounded on either side by two branches 10. Such an input terminal 4 is particularly suitable for connection to an output track 300 in the form of a pad.

According to a preferred aspect of the invention illustrated in FIGS. 4 and 5, the cavity 5 of each input terminal 4 comprises a supply opening 12 opening out on the peripheral edge of the interconnecting member 1 configured to receive the conductive adhesive and guide it into the cavity 5. Preferably, the electrically interconnecting member 1 comprises a notch 9 formed in the peripheral edge into which the supply opening 12 opens. Advantageously, such a notch 9 allows conductive adhesive to be deposited easily and quickly, with the right dosage and without any risk of spillage, while still being accessible once the contact surface 2 has been pressed against the mechanical part 100. The notch 9 allows an adhesive injection tool, such as a syringe, to be precisely positioned to allow a fast, reliable and industrialisable electrical connection.

According to a preferred aspect of the invention, the cavity 5 is capillary, i.e. it is sufficiently narrow to allow the conductive adhesive to be distributed solely under the effect of capillarity. In practice, the capillary cavity 5 comprises a width of less than 1 mm, preferably less than 0.6 mm and more preferably less than 0.3 mm. Preferably also, the width of the notch 9 is at least twice that of the cavity 5, so as to facilitate the deposition of conductive adhesive. Advantageously, the conductive adhesive, in its liquid state, is deposited in the notch 9 and then distributed spontaneously, i.e. without human intervention, throughout the cavity 5. Advantageously, this allows to establish a reliable, permanent electrical connection between an input terminal 4 and the output track 300 of the superimposed printed circuit board 200, thanks to an even distribution of conductive adhesive. The dosage of conductive adhesive is also improved.

In the preferred example shown in FIGS. 4 and 5, the branches 10 of each input terminal 4 are conductive so that an electrical connection may be made in the absence of adhesive. This allows to ensure that the interconnecting member 1 is correctly positioned on the output tracks 300, which are not visible, before the adhesive is applied.

Preferably, the branches 10 comprise a narrow portion where they are close together to define the cavity 5 and a portion widened at the level of the edge to define the notch 9. The branches 10 thus consecutively define the cavity 5 and the notch 9 of an input terminal 4.

With reference to [FIG. 6], a method for electrically connecting the electrically interconnecting member 1 to a printed circuit board 200 on a mechanical part 100 is hereinafter described, comprising the steps of:

- Positioning E1 the electrically interconnecting member 1 on the mechanical part 100 so that the input terminals 4 of the electrically interconnecting member 1 and the output tracks 300 of the printed circuit board 200 are superimposed,
- Fastening E2 the electrically interconnecting member 1 to the mechanical part 100, and
- Filling E3 the cavity 5 of at least one input terminal 4 of the electrically interconnecting member 1 with a conductive adhesive 6, so as to electrically connect the input terminal 4 to the superimposed output track 300 of the printed circuit board 200.

The positioning step E1, fastening step E2 and filling step E3 allow the electrically interconnecting member 1 to be connected to the printed circuit board 200.

Figure 7:
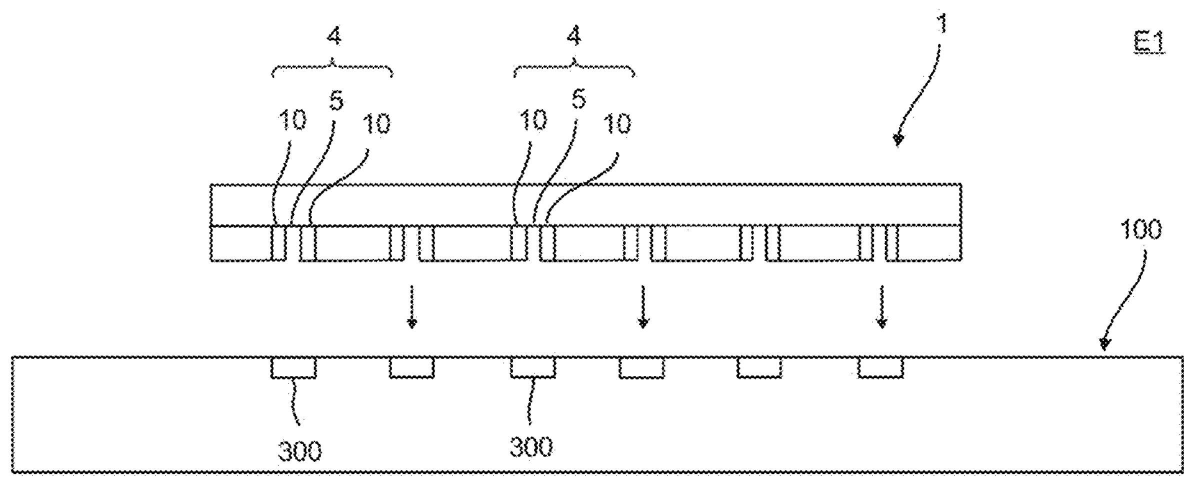
FIG. 7 is a schematic cross-sectional representation of a step wherein the electrically interconnecting member is superimposed on the printed circuit board according to the electrical connection method of [FIG. 6].

With reference to [FIG. 7], during the superimposition step E1, the electrically interconnecting member 1 is positioned on the mechanical part 100 so that the contact surface 2 extends in contact with the part 100 and the input terminals 4 are in contact in pairs with the output tracks 300 of the printed circuit board 200. Preferably, the electrically interconnecting member 1 or the part 100 comprises positioning means to facilitate superimposition. In one aspect, the electrically interconnecting member 1 is transparent, which allows to visually check the superimposition with the output tracks 300 of the printed circuit board 200. Cumulatively or alternatively, the part 100 comprises a marking for positioning the electrically interconnecting member 1. In a preferred aspect, the marking of the part 100 is configured to coincide with the through openings 11 of the electrically interconnecting member 1 for simple and accurate superimposition.

Preferably, at the end of the superimposition step E1, temporary fastening means hold the electrically interconnecting member 1 relative to the part 100 in the superimposition position, such as adhesive strips by way of example. The electrically interconnecting member 1 may also be pressed onto the part 100.

Figure 8:
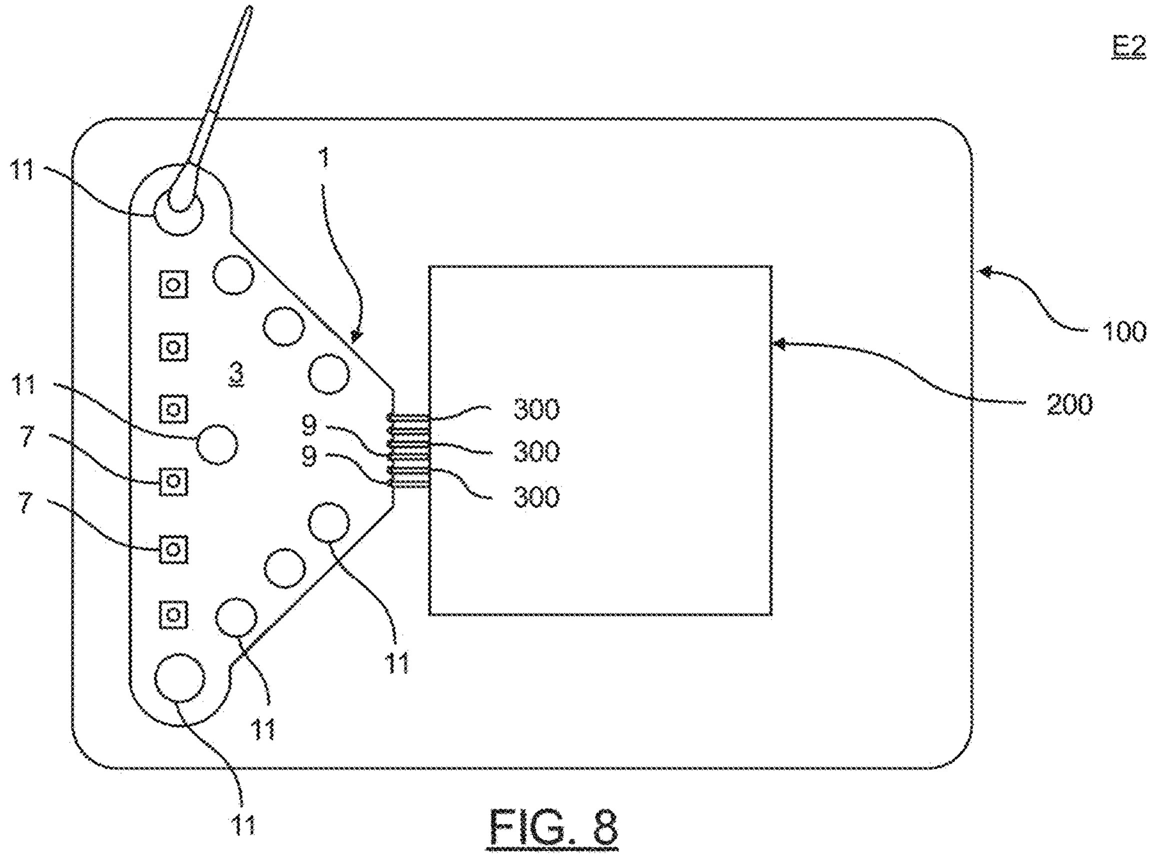
FIG. 8 is a schematic representation in plan view of a step for fastening the electrically interconnecting member to the printed circuit board according to the electrical connection method of [FIG. 6].

With reference to [FIG. 8], the fastening step E2 is implemented after the superimposition step E1 and allows the electrically interconnecting member 1 to be fastened to the part 100 in the superimposition position. According to a preferred aspect of the invention, the fastening step E2 is implemented by gluing. Preferably, the fastening step E2 is implemented by depositing adhesive in the through openings 11 on the part 100. At the end of the fastening step E2, the electrically interconnecting member 1 is fastened at the level of its contact surface 2 to the part 100 so that the input terminals 4 are superimposed on the output tracks 300 of the printed circuit board 200.

Figure 9:
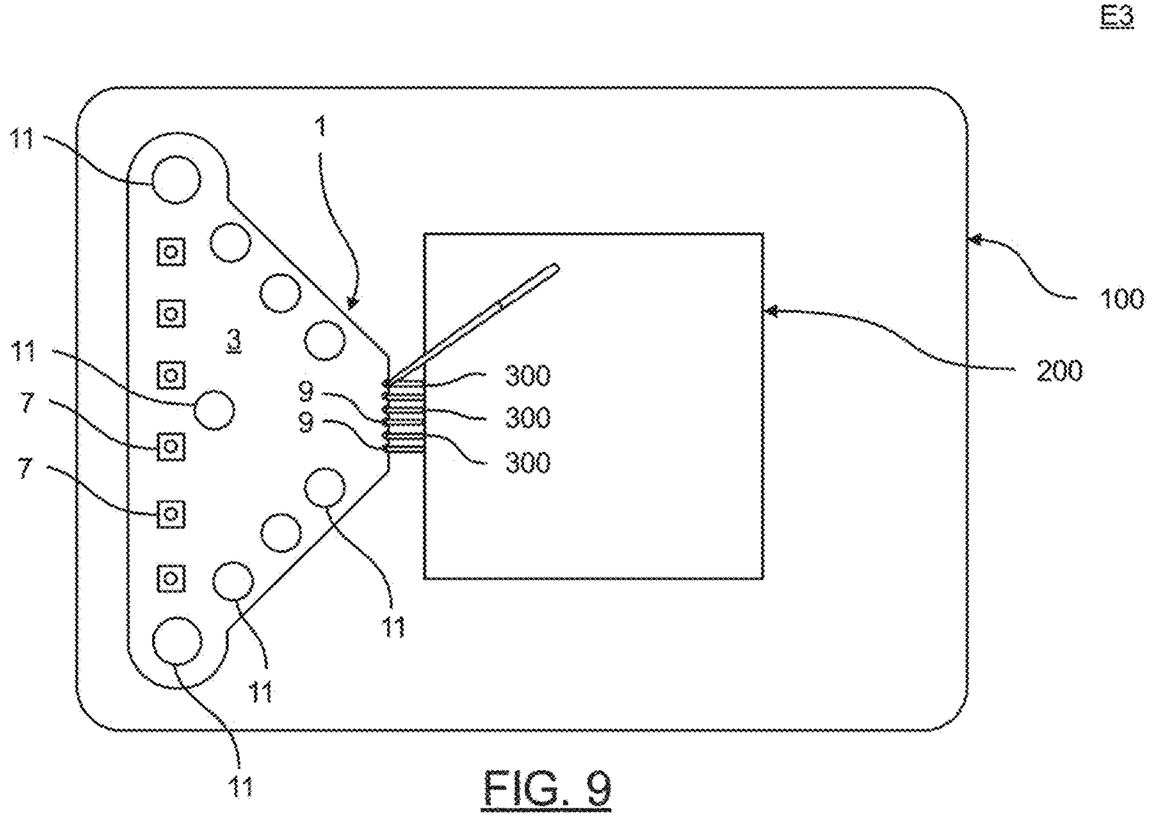
FIG. 9 is a schematic representation in plan view of a step of filling the cavity of the input terminals of the electrically interconnecting member with a conductive adhesive according to the electrical connection method of [FIG. 6].
Figure 10:
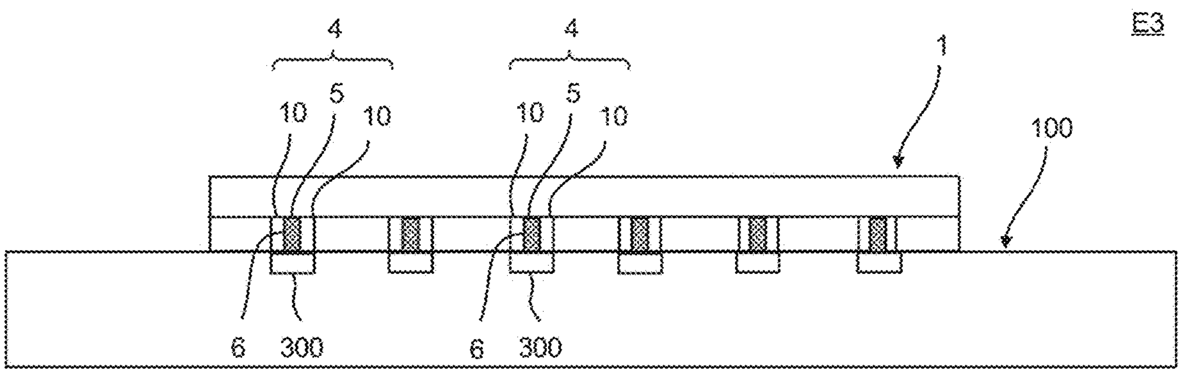
FIG. 10 is a schematic cross-sectional representation of the filling step in [FIG. 9].

Referring to FIGS. 9 and 10, after the fastening step E2, during the filling step E3, the cavity 5 of the input terminals 4 is filled with conductive adhesive 6, preferably silver-based. The conductive adhesive 6 has both adhesive and conductive properties, allowing the input terminals 4 to be fastened against the output tracks 300 and maintaining electrical contact between them. According to a preferred aspect illustrated in [FIG. 10], the branches 10 and the conductive adhesive 6 together allow to establish the electrical contact between the input terminals 4 and the output tracks 300. The resulting electrical connection is both reliable and durable.

According to a preferred aspect illustrated in [FIG. 9], during the filling step E3, the conductive adhesive 6 is deposited using a syringe positioned precisely by means of the notch 9 so as to allow an injection into the supply opening 12 of the cavity 5 of each input terminal 4. The conductive adhesive 6 is then distributed in the cavity 5 by capillary action. Depositing conductive adhesive 6 in the notches 9 is advantageously simple, quick and reproducible. The notches 9 prevent short-circuiting or damage. This also allows a precise dosing of the conductive adhesive 6 required, avoiding costly wastage and any risk of spillage. No human intervention is required to distribute the conductive adhesive 6 in the cavity 5. At the end of the filling step E3, the electrically interconnecting member 1 is connected to the printed circuit board 200. It should be noted that the filling step E3 could be implemented in only one region of the input terminals 4, in which case only the electrical lines 13 concerned could be connected to the piece of electrical equipment 400.

The result is a mechanical part 100 that may easily be connected to a piece of electrical equipment 400. The electrically interconnecting member 1 has a small overall dimension and a low mass, which is of little disadvantage for an aeronautical part 100.

Figure 6:
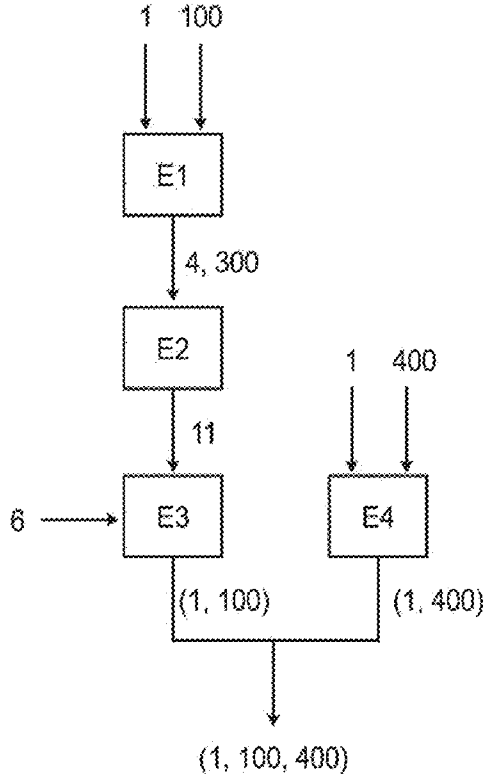
FIG. 6 is a schematic representation of a method for electrically connecting the piece of electrical equipment to a printed circuit board belonging to a mechanical part via an electrically interconnecting member according to the invention.

Following the installation of the electrically interconnecting member 1, the mechanical part 100 may be introduced into an assembly line wherein a piece of electrical equipment 400 is connected to the output interfaces 7 of the electrically interconnecting member 1 (connection step E4 illustrated in [FIG. 6]). Because the output interfaces 7 are spaced apart and positioned at a distance from the printed circuit board 200, the connection may be made quickly and conveniently. Such a connection could even be automated.

With reference to FIGS. 1 and 6, the connection step E4 allows to connect the piece of electrical equipment 400, and more specifically its connectors 500, of which there are six in this example, to the output interfaces 7. The connection step E4 is implemented by soldering, by tin soldering or by means of relay terminals by way of example, preferably by soldering in a simple and practical way. Preferably, the connectors 500 are also fastened to the mechanical part 100, for example by adhesive gluing, to ensure a reliable and durable connection while preserving the aerodynamics of the part 100.

The connection step E4 is therefore implemented independently of positioning step E1, fastening step E2 and filling step E3, preferably after these steps.

The invention claimed is:

1. An electrically interconnecting member configured to electrically connect a printed circuit board belonging to a mechanical part to at least one piece of electrical equipment, the printed circuit board comprising a plurality of output tracks, said electrically interconnecting member comprising:

a contact surface configured to be fastened to the mechanical part, a free surface opposite the contact surface, a plurality of input terminals placed on the contact surface, each of the input terminals being configured to be superimposed on an output track of the plurality of output tracks of the printed circuit board, a plurality of output interfaces placed on the free surface at a distance from the input terminals and configured to be connected to the piece of electrical equipment, each of the input terminals being connected to an output interface of the plurality of output interfaces by an electrical track, at least one input terminal of said plurality of input terminals defining a cavity configured to receive a conductive adhesive so as to connect together the input terminal and the output track when they are superimposed.

2. The electrically interconnecting member according to claim 1, wherein each of the input terminals extends longitudinally.

3. The electrically interconnecting member according to claim 2, wherein the cavity extends over at least a longitudinal portion of the input terminal.

4. The electrically interconnecting member according to claim 1, wherein a spacing between two of the output interfaces that are adjacent one another is greater than a spacing between two of the input terminals that are adjacent one another.

5. The electrically interconnecting member according to claim 1, wherein the cavity comprises a supply opening accessible from the free surface or from a peripheral edge of the electrically interconnecting member.

6. The electrically interconnecting member according to claim 5, comprising at a level of the peripheral edge at least one notch into which the supply opening opens.

7. The electrically interconnecting member according to claim 1, wherein the cavity of at least one of the input terminals comprises a capillary structure so as to promote a distribution of the conductive adhesive throughout the cavity.

8. The electrically interconnecting member according to claim 1, wherein at least one of the input terminals comprises two lateral branches delimiting the cavity between them.

9. The electrically interconnecting member according to claim 8, wherein the two lateral branches are conductive.

10. The electrically interconnecting member according to claim 1, comprising a plurality of through fastening openings which are distributed.

11. An assembly of the mechanical part comprising the printed circuit board and the electrically interconnecting member according to claim 1, the printed circuit board comprising the plurality of output tracks, wherein:

the contact surface of the electrically interconnecting member is fastened to the mechanical part, the input terminals of the electrically interconnecting member are superimposed on the output tracks of the printed circuit board, at least one of the input terminals defining the cavity filled with the conductive adhesive connecting the input terminal together with the output track on which it is superimposed.

12. The assembly according to claim 11, wherein the mechanical part is an engine part.

13. An aircraft turbomachine comprising an assembly according to claim 11.

14. An aircraft comprising the aircraft turbomachine according to claim 13.

15. The assembly according to claim 11, wherein the mechanical part is an aircraft turbomachine part.

16. The assembly according to claim 11, wherein the mechanical part is a stationary aircraft turbomachine vane.

17. A method for electrically connecting the electrically interconnecting member according to claim 1 to the printed circuit board belonging to the mechanical part, said method comprising:

positioning the electrically interconnecting member on the mechanical part so that the input terminals of the electrically interconnecting member and the output tracks of the printed circuit board are superimposed, fastening the electrically interconnecting member to the mechanical part, and filing the cavity of at least one of the input terminals of the electrically interconnecting member with the conductive adhesive, so as to electrically connect the input terminal to the output track of the printed circuit board on which it is superimposed.

* * * * *